United States Patent [19]
Ishida et al.

[11] Patent Number: 6,166,429
[45] Date of Patent: Dec. 26, 2000

[54] LEAD-FRAME PACKAGE WITH SHIELD MEANS BETWEEN SIGNAL TERMINAL ELECTRODES

[75] Inventors: Hidetoshi Ishida, Kyoto; Kazuo Miyatsuji, Settsu; Daisuke Ueda, ibaraki, all of Japan

[73] Assignee: Matsushita Electronics Corporation, Osaka, Japan

[21] Appl. No.: 09/033,240

[22] Filed: Mar. 3, 1998

[30] Foreign Application Priority Data

Mar. 4, 1997 [JP] Japan .................................. 9-048664

[51] Int. Cl.[7] ........................... H01L 23/48; H01L 23/495
[52] U.S. Cl. .................... 257/665; 257/659; 257/662; 257/668; 257/784; 257/698
[58] Field of Search ....................... 257/665, 659, 257/662, 784, 668, 698

[56] References Cited

U.S. PATENT DOCUMENTS

| | | | |
|---|---|---|---|
| 5,631,809 | 5/1997 | Takagi et al. | 361/820 |
| 5,869,898 | 2/1999 | Sato | 257/728 |
| 5,894,171 | 4/1999 | Uda | 257/784 |

Primary Examiner—Leo P. Picard
Assistant Examiner—Hung Van Duong
Attorney, Agent, or Firm—McDermott, Will & Emery

[57] ABSTRACT

A semiconductor device has the following structure: a lead frame 2 is disposed on the center of a package 1, signal terminal electrodes 3 through 7 are disposed on edges of the package, a semiconductor chip 8 is mounted on the lead frame 2, a grounding electrode 16 having a grounding potential is disposed between the signal terminal electrodes 4 and 5, and a grounding electrode having a grounding potential is disposed between the signal terminal electrodes 5 and 6. This structure increases an electrical separation between the signal terminal electrodes.

2 Claims, 5 Drawing Sheets

LEAD-FRAME PACKAGE WITH SHIELD MEANS BETWEEN SIGNAL TERMINAL ELECTRODES

FIELD OF THE INVENTION

The present invention relates to a semiconductor device having a package which stores a high-frequency device.

BACKGROUND OF THE INVENTION

Recently, mobile communication terminals including a portable telephone, a personal handy-phone system (PHS), etc. are requested to be smaller and smaller in size. In order to meet this request, a package of semiconductor device employed in the mobile communication terminals is to be downsized.

A conventional semiconductor device is described by referring to FIG. 5. FIG. 5 is a plan view of the conventional semiconductor device having a mini-package with six terminals. The mini-package stores a semiconductor chip. A lead frame 2 is disposed at the center of the package 1, signal terminal electrodes 3 through 7 are disposed on the edges of the package 1. A semiconductor chip 8 is mounted on the lead frame 2. Chip electrodes 9 through 13 disposed on the semiconductor chip 8 are coupled to the signal terminal electrodes 3 through 7 with wires 15 respectively. A chip electrode 14 disposed on the semiconductor chip 8 is coupled to the lead frame 2 with the wire 15. A clearance between the adjacent signal terminal electrodes 4, 5 and 6 is 0.5 mm each.

In the above conventional semiconductor device, when a package is requested to be downsized, the clearance between the adjacent signal terminal electrodes such as the signal terminal electrodes 4 and 5 is considered to be narrowed.

On the other hand, when the semiconductor device is worked at a high frequency, the signal terminal electrodes must be electrically separated with each other, in other words, an isolation between the signal terminal electrodes should be strictly maintained. The clearance between the adjacent signal terminal electrodes thus needs a predetermined distance. When the isolation of −30 dB is required, the clearance must be no less than 0.5 mm.

Accordingly, in the above conventional semiconductor device, the two goals, i.e. downsizing and isolation are not satisfied simultaneously.

SUMMARY OF THE INVENTION

The present invention aims to provide a semiconductor device with a downsized package while the isolation between the signal terminal electrodes is maintained at a high level.

The present invention is featured to dispose shield means between signal terminal electrodes for preventing electrical interference therebetween.

A semiconductor device in a preferred embodiment according to the present invention comprises the following elements;

(a) a package,
(b) a lead frame disposed on the center of the package,
(c) a plurality of signal terminal electrodes disposed on edges of the package,
(d) a semiconductor chip mounted on the lead frame, and
(e) a grounding electrode having a grounding potential disposed between the adjacent two signal terminal electrodes.

Another semiconductor device used in another preferred embodiment according to the present invention comprises the following element;

(a) a package,
(b) a lead frame disposed on the center of the package,
(c) a plurality of signal terminal electrodes disposed on edges of the package,
(d) a semiconductor chip mounted on the lead frame, and
(e) a bridge-shaped-conductive-wire having a grounding potential disposed on the center of the lead frame so that the conductive wire crosses the semiconductor chip.

Thanks to the grounding electrode as well as the bridge-shaped-conductive-wire, the signal terminal electrodes are shielded electrically with each other.

DESCRIPTION OF THE PREFERRED EMBODIMENTS

Embodiment 1

Figure 1:
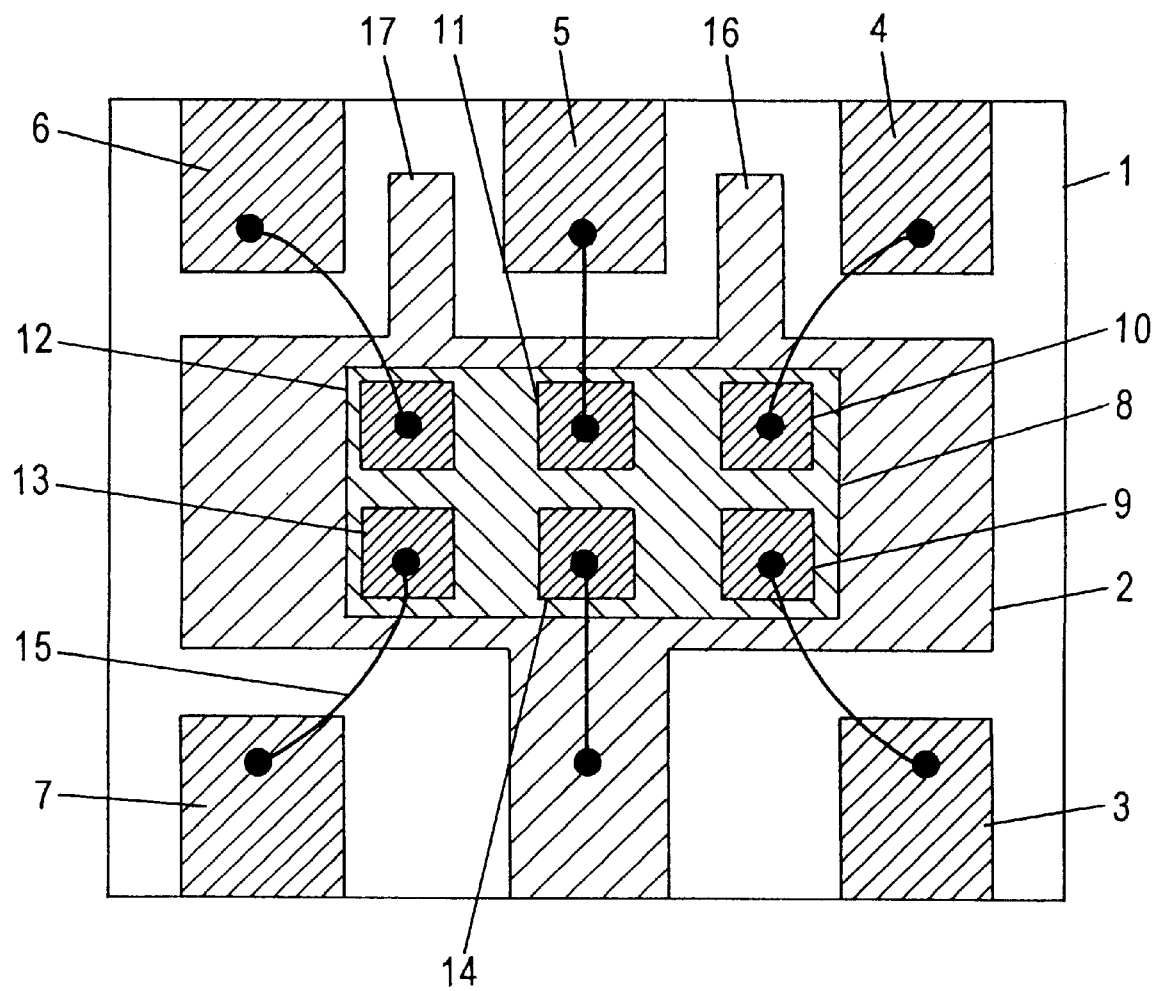
FIG. 1 is a plan view of a semiconductor device used in Embodiment 1 of the present invention.

FIG. 1 is a plan view of the semiconductor device used in Embodiment 1 according to the present invention.

The semiconductor device comprises the following elements:

(a) a package 1,
(b) a lead frame 2 disposed on center part of the package 1,
(c) signal terminal electrodes 3 through 7 disposed on the edges of the package,
(d) a semiconductor chip 8 mounted on the lead frame 2,
(e) chip electrodes 9 through 14 disposed on the semiconductor chip 8,
(f) wires 15, one of the wires 15 coupling the chip electrode 14 to the lead frame 2, and other wires 15 coupling the chip electrodes 9 through 13 to the signal terminal electrodes 3 through 7 respectively,
(g) a grounding electrode 16 integrated into the lead frame 2, having a grounding potential, being disposed between the signal electrodes 4 and 5, and
(h) a grounding electrode 17 integrated into the lead frame 2, having a grounding potential, being disposed between the signal electrodes 5 and 6.

Now, an operation of the above semiconductor device is described.

A signal fed into the signal terminal electrode 4 runs through the wire 15 and the chip electrode 10, and is amplified and attenuated in the semiconductor chip 8, then the signal runs through the chip electrode 11 and the wire 15, finally it is tapped off from the signal terminal electrode 5. During this signal transmission, since the grounding electrode 16 having a grounding potential is disposed between the signal terminal electrodes 4 and 5, an electromagnetic wave generated from the signal terminal electrode 4 is shielded, and thus the signal electrode terminal 5 is affected little by the electromagnetic wave. In the same way, an electromagnetic wave generated from the signal terminal electrode 5 is shielded by the grounding electrode 16. As a result, an excellent isolation is gained between the signal terminal electrodes 4 and 5.

Figure 2:
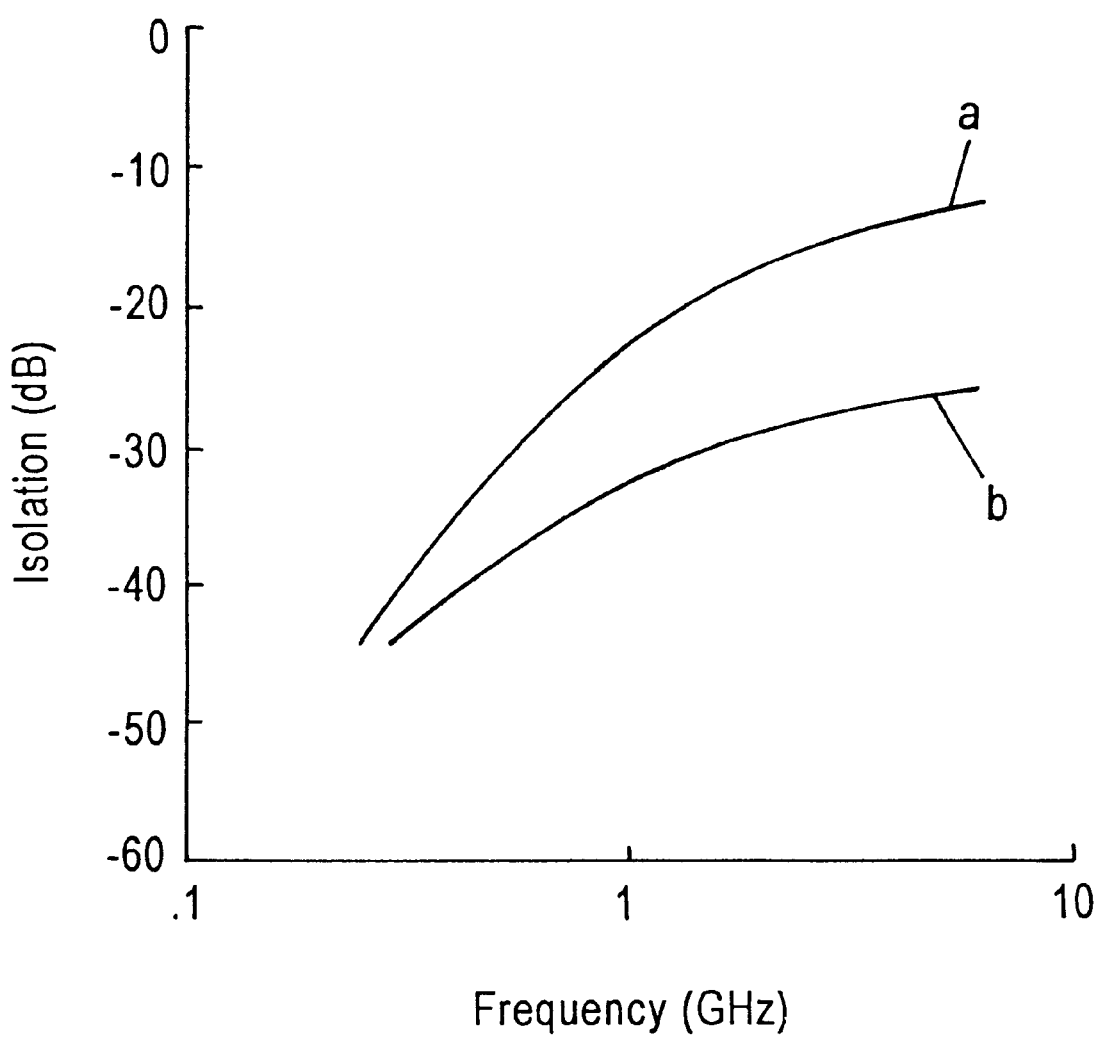
FIG. 2 shows a frequency characteristic of the semiconductor device used in Embodiment 1 and that of a conventional semiconductor.

FIG. 2 shows relations between a frequency and an isolation for a conventional semiconductor device with the curve (a) and for the semiconductor device used in Embodiment 1 with the curve (b). This chart depicts that the isolation is improved in the semiconductor device having the grounding electrodes 16 and 17, and being used in Embodiment 1 comparing with the conventional semiconductor device.

In the above embodiment, a package with six terminals is used, however; the same effect can be gained in other packages with multi-terminals.

Embodiment 2

Figure 3:
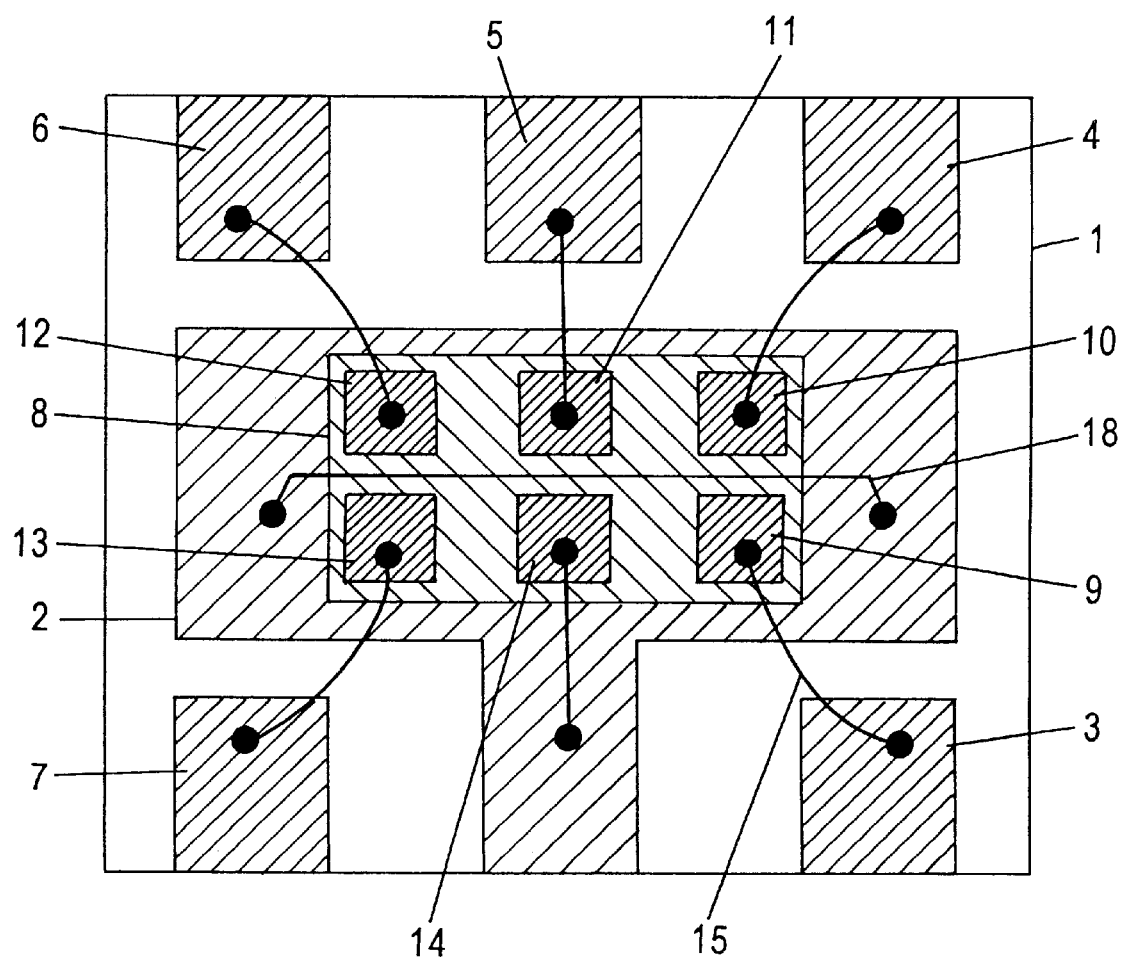
FIG. 3 is a plan view of a semiconductor device used in Embodiment 2.

FIG. 3 is a plan view of a semiconductor device used in Embodiment 2.

The following points differ Embodiment 2 from Embodiment 1: (a) The semiconductor device used in Embodiment 2 does not have the grounding electrodes 16 and 17, and (b) a bridge shaped and conductive grounding wire 18 having a grounding potential is disposed on the center part of the lead frame 2 so that the grounding wire 18 crosses the semiconductor chip 8.

In this semiconductor device, since the grounding wire 8 shields electromagnetic waves generated from the signal terminal electrodes 3 and 7, isolation between the signal terminal electrodes 4, 5, 6 and the signal terminal electrodes 3, 7 is increased.

Figure 4:
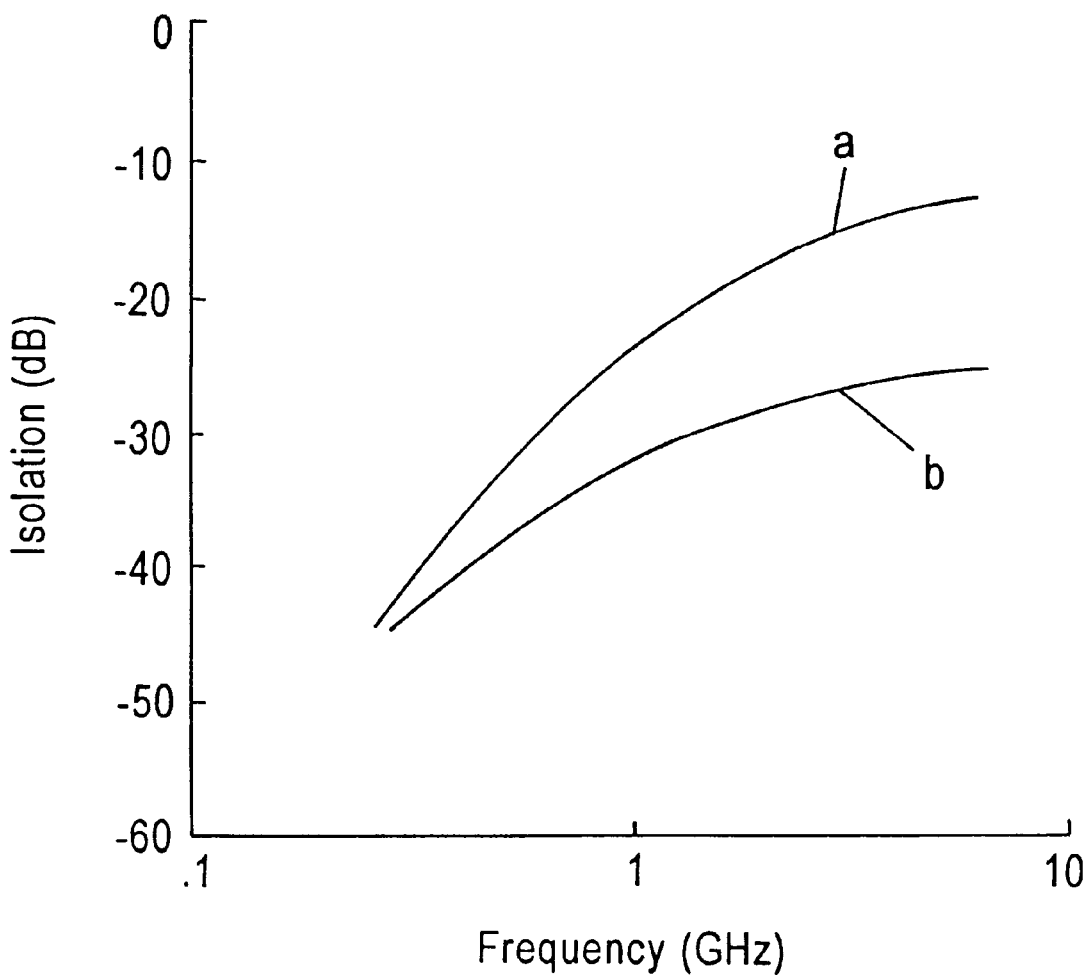
FIG. 4 shows a frequency characteristic of the semiconductor device used in Embodiment 2 and that of the conventional semiconductor device.
Figure 5:
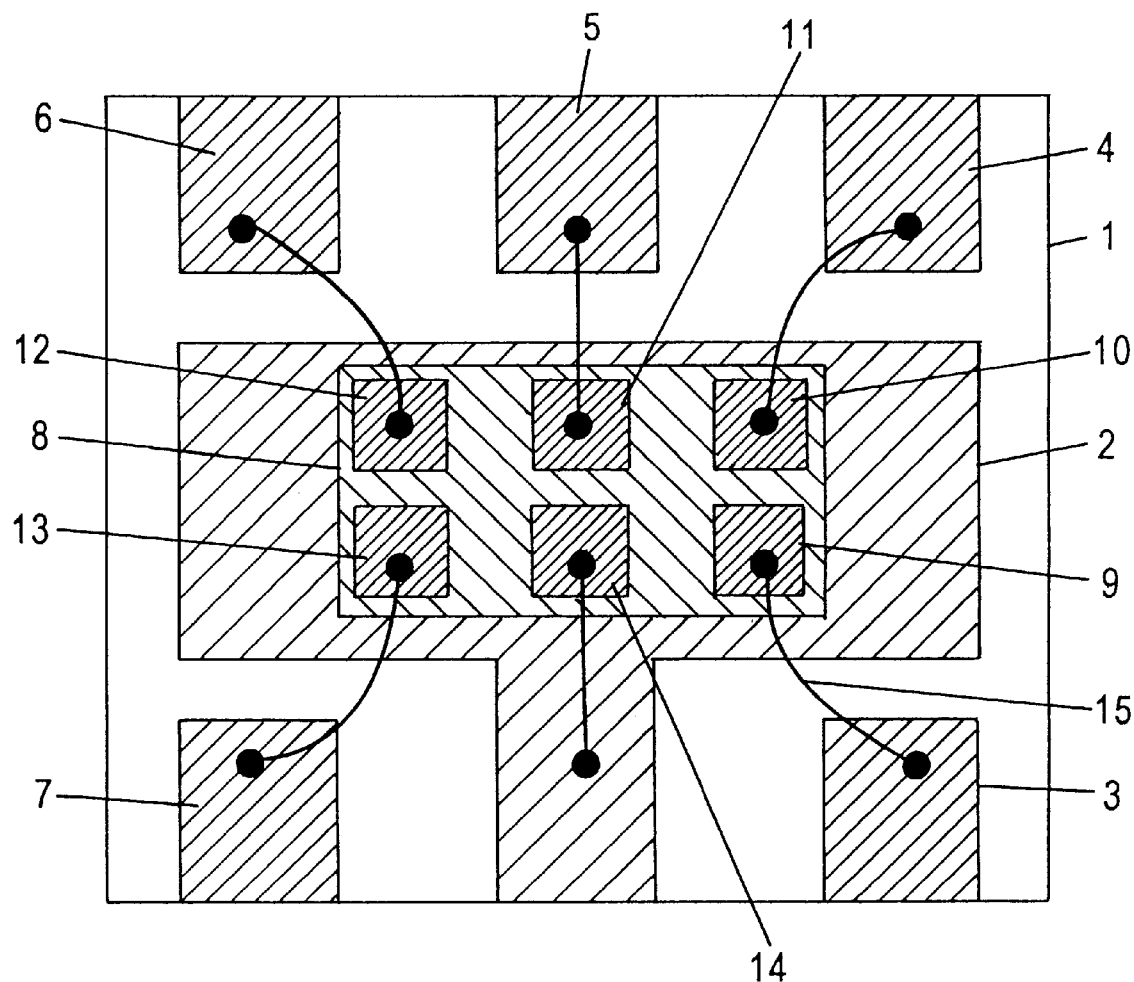
FIG. 5 is a plan view of the conventional semiconductor device.

FIG. 4 shows relations between a frequency and an isolation for a conventional semiconductor device with the curve (a) and for the semiconductor device used in Embodiment 2 with the curve (b). This chart depicts that the isolation is improved in the semiconductor device having the grounding wire 18, and being used in Embodiment 2 comparing with the conventional semiconductor device.

As explained above, the present invention can provide the downsized semiconductor device with less electrical interference by (1) disposing the lead frame on the center of the package as well as the plurality of signal terminal electrodes on the edges of the package, (2) mounting a semiconductor chip on the lead frame, and (3) disposing a grounding electrode having a grounding potential between the adjacent two signal terminal electrodes.

What is claimed is:

1. A semiconductor device comprising:
   (a) a package,
   (b) a lead frame disposed on a center part of said package,
   (c) a plurality of signal terminal electrodes disposed on edges of said package,
   (d) a semiconductor chip mounted on said lead frame, and
   (e) shield means for preventing electrical interference between said signal terminal electrodes, said shield means comprising a bridge-shaped-conductive-wire having a grounding potential, which is disposed on a center of said lead frame so that the bridge-shaped-conductive-wire crosses said semiconductor chip.

2. The semiconductor device of claim 1, wherein said shield means comprises a grounding electrode having a grounding potential and being disposed between adjacent two said signal terminal electrodes.

* * * * *